United States Patent
Park et al.

(10) Patent No.: US 8,535,995 B2
(45) Date of Patent: Sep. 17, 2013

(54) METHOD OF MANUFACTURING ORGANIC LIGHT-EMITTING DISPLAY DEVICE

(75) Inventors: Jong-Hyun Park, Yongin (KR); Chun-Gi You, Yongin (KR); Sun Park, Yongin (KR); Yul-Kyu Lee, Yongin (KR); Sang-Ho Moon, Yongin (KR)

(73) Assignee: Samsung Display Co., Ltd. (KR)

( * ) Notice: Subject to any disclaimer, the term of this patent is extended or adjusted under 35 U.S.C. 154(b) by 36 days.

(21) Appl. No.: 13/183,134

(22) Filed: Jul. 14, 2011

(65) Prior Publication Data

US 2012/0178196 A1   Jul. 12, 2012

(30) Foreign Application Priority Data

Jan. 11, 2011   (KR) .......................... 10-2011-0002763

(51) Int. Cl.
*H01L 21/00* (2006.01)
*H01L 21/84* (2006.01)
*H01L 23/52* (2006.01)

(52) U.S. Cl.
USPC ............................ 438/155; 438/163; 257/211

(58) Field of Classification Search
USPC .................................. 438/34; 257/E33.053
See application file for complete search history.

(56) References Cited

U.S. PATENT DOCUMENTS

| 2006/0008955 A1* | 1/2006 | Sera et al. ...................... 438/163 |
| 2007/0235767 A1* | 10/2007 | Lee ................................ 257/211 |
| 2008/0070351 A1* | 3/2008 | Oue et al. ...................... 438/155 |

FOREIGN PATENT DOCUMENTS

| KR | 10-2003-0082139 A | 10/2003 |
| KR | 10-0611759 B1 | 8/2006 |
| KR | 10-0754126 B1 | 8/2007 |
| KR | 10-0908850 B1 | 7/2009 |

* cited by examiner

*Primary Examiner* — Fernando L Toledo
*Assistant Examiner* — Valerie N Newton
(74) *Attorney, Agent, or Firm* — Knobbe Martens Olson & Bear, LLP

(57) ABSTRACT

A method of manufacturing an organic light-emitting display device includes forming a silicon layer and a gate insulating film over a substrate having a transistor region and a capacitor region; forming a halftone photoresist over the substrate; patterning the silicon layer and the gate insulating film; forming a residual photoresist by subjecting the halftone photoresist to an ashing process to leave part of the halftone photoresist over the transistor region; and doping at least a portion of the silicon layer with impurities by applying the impurities over an entire region of the substrate.

24 Claims, 13 Drawing Sheets

METHOD OF MANUFACTURING ORGANIC LIGHT-EMITTING DISPLAY DEVICE

This application claims priority from Korean Patent Application No. 10-2011-0002763 filed on Jan. 11, 2011 in the Korean Intellectual Property Office, the disclosure of which is incorporated herein by reference in its entirety.

BACKGROUND

1. Field

The present disclosure relates to a method of making an organic light-emitting display device, and more particularly, to impurity doping process during manufacture of an organic light-emitting display device.

2. Description of the Related Art

The rapid development of the information and technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

Organic light-emitting displays, which are next-generation display devices having self light-emitting characteristic, have better characteristics than liquid crystal displays in terms of viewing angle, contrast, response speed and power consumption, and can be manufactured to be thin and lightweight since a backlight is not required.

An organic light-emitting display includes a substrate having a pixel region and a non-pixel region and a container or another substrate which is placed to face the substrate for encapsulation and attached to the substrate by a sealant such as epoxy. In the pixel region of the substrate, a plurality of organic light-emitting diodes (OLEDs) are connected in a matrix pattern between scan lines and data lines to form pixels. In the non-pixel region, the scan lines and the data lines extending from the scan lines and the data lines of the pixel region, power source supply lines for operating the OLEDs, and a scan driver and a data driver for processing signals received from an external source via input pads and providing the processed signals to the scan lines and the data lines are formed.

Hereinafter, an example of a method of manufacturing an organic light-emitting display device, particularly, a bottom emission organic light-emitting display device is described with reference to FIGS. 1 through 6.

Referring to FIG. 1, a buffer layer is formed on a substrate having a pixel region, a transistor region and a capacitor region, and a silicon layer is formed on the buffer layer. Then, the silicon layer is patterned to form semiconductor layers (DR_TFT and SW_TFT) on the transistor region and form an electrode (STC) on the storage capacitor region. A gate insulating film is formed on the patterned silicon layer.

Referring to FIG. 2, a gate electrode material is provided on the entire substrate and then patterned to form a gate electrode GATE on each of the pixel region, the transistor region and the capacitor region. Next, the silicon layers DR_TFT and SW_TFT of the transistor region are doped with impurities in order to turn the silicon layers DR_TFT and SW_TFT into semiconductors. Here, the gate electrode GATE formed on the transistor region prevents a central portion of each of the silicon layers DR_TFT and SW_TFT from being doped with impurities. On the other hand, since the entire silicon layer STC of the capacitor region is covered with the gate electrode GATE, doping ions cannot penetrate into the silicon layer STC.

Referring to FIG. 3, an interlayer insulating film IDL is formed on the entire substrate and is then patterned to form an open region, which corresponds to the pixel region, and contact holes for forming source and drain electrodes S/D.

Referring to FIG. 4, the source and drain electrodes S/D is patterned on the transistor region. Then, the gate electrode GATE formed on each of the pixel region and the capacitor region is removed. Since the gate electrode GATE, which covers the silicon layer STC of the capacitor region and thus prevents the silicon layer STC from being doped as shown in FIG. 2, is removed, an additional doping process is performed to turn the silicon layer STC into an electrode.

Referring to FIG. 5, a pixel defining layer PDL is formed and then patterned to expose a transparent electrode (indium tin oxide (ITO)) of the pixel region (indicated by reference character 'PIXEL' in FIG. 5). The transistor region and the capacitor region are covered with the pixel defining layer PDL and thus are not exposed.

As described above, in the above example of a method of manufacturing an organic light-emitting display device, a polysilicon layer of a transistor region and a polysilicon layer of a capacitor region are doped separately through two rounds of doping. Such two rounds of doping are disadvantageous in terms of processing time and cost.

When the polysilicon layers (DR_TFT and SW_TFT) of the transistor region are doped with impurity ions, since only a gate insulating film exists on each of the polysilicon layers, a usual acceleration voltage for a doping process is used. However, when the polysilicon layer (STC) of the capacitor region is doped with impurity ions, since a gate insulating film and a transparent electrode layer (ITO) exist on the polysilicon layer, a higher acceleration voltage is required. Such use of different acceleration voltages is disadvantageous in terms of processing time and cost.

Resistance under a doped polysilicon layer tends to increase. Therefore, to reduce the resistance, a heat treatment process is additionally required after the polysilicon layers of the transistor region and the capacitor region, to which a high frequency is applied, are doped separately. The additional heat treatment process is disadvantageous in terms of processing time and cost.

As recently suggested, in order to improve a viewing angle, an anode electrode may be formed to have a multilayered structure of ITO-silver (Ag)—ITO as shown in FIG. 6, instead of a single layered structure of ITO. In this case, an Ag layer is formed on the capacitor region, in addition to a transparent electrode (ITO). Since the transparent electrode (ITO) and the metal layer are stacked on the polysilicon layer (STC) of the capacitor region, it is difficult to dope the polysilicon layer formed on the capacitor region.

The foregoing discussion in the background section is to provide general background information, and does not constitute an admission of prior art.

SUMMARY

Aspects of the present invention provide a method of manufacturing an organic light-emitting display device, in which a silicon layer of a transistor region and a silicon layer of a capacitor region can be doped simultaneously by a single doping process, and a heat treatment process for activating the doped silicon layers is not required.

Aspects of the present invention also provide a method of manufacturing an organic light-emitting display device, in which a silicon layer of a transistor region and a silicon layer of a capacitor region can be doped simultaneously by a single doping process without changing an acceleration voltage.

Aspects of the present invention also provide a method of manufacturing an organic light-emitting display device, in which a multilayered structure of indium tin oxide (ITO)-silver (Ag)—ITO can be employed to improve a viewing angle of the organic light-emitting display device.

However, aspects of the present invention are not restricted to the one set forth herein. The above and other aspects of the present invention will become more apparent to one of ordinary skill in the art to which the present invention pertains by referencing the detailed description given below.

According to an aspect of the present invention, there is provided a method of manufacturing a bottom emission organic light-emitting display device. The method includes: forming a silicon layer and a gate insulating film over a substrate having a transistor region and a capacitor region; forming a photoresist over the substrate; patterning the silicon layer and the gate insulating film; forming a residual photoresist by leaving part of the photoresist unremoved; and doping at least a portion of the silicon layer with impurities by applying the impurities over an entire region of the substrate.

According to another aspect of the present invention, there is provided a method of manufacturing a bottom emission organic light-emitting display device. The method includes: forming a silicon layer and a gate insulating film over a substrate having a pixel region, a transistor region and a capacitor region; forming a halftone photoresist on the substrate; patterning the silicon layer and the gate insulating film; forming a residual photoresist by subjecting the halftone photoresist to an ashing process to leave part of the halftone photoresist over the transistor region; doping at least a portion of the silicon layer with impurities by applying the impurities over an entire region of the substrate; removing the residual photoresist; and forming a triple-layered anode electrode, which comprises a transparent electrode material-a metal-a transparent electrode material, over each of the pixel region, the transistor region, and the capacitor region.

BRIEF DESCRIPTION OF THE DRAWINGS

The above and other aspects and features of the present invention will become more apparent by describing in detail embodiments thereof with reference to the attached drawings, in which.

DETAILED DESCRIPTION OF EMBODIMENTS

Figure 1:
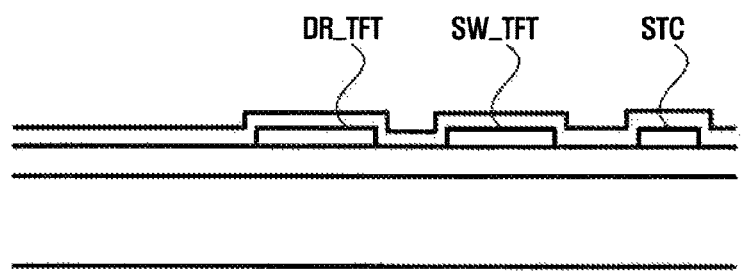
FIGS. 1 through 6 are cross-sectional views illustrating an example of a method of manufacturing an organic light-emitting display device.
Figure 2:
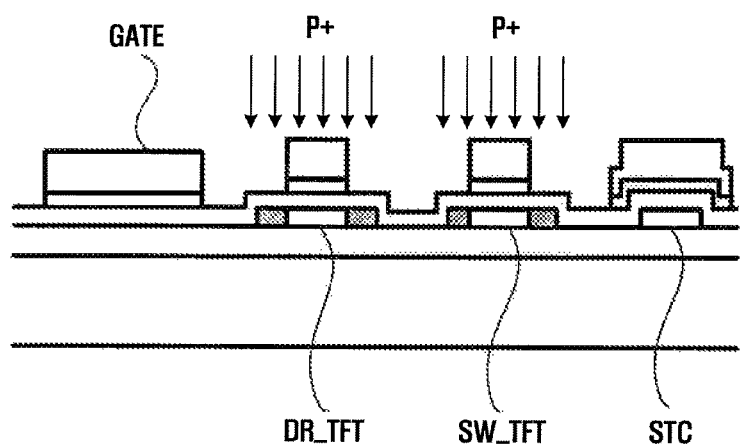
Figure 3:
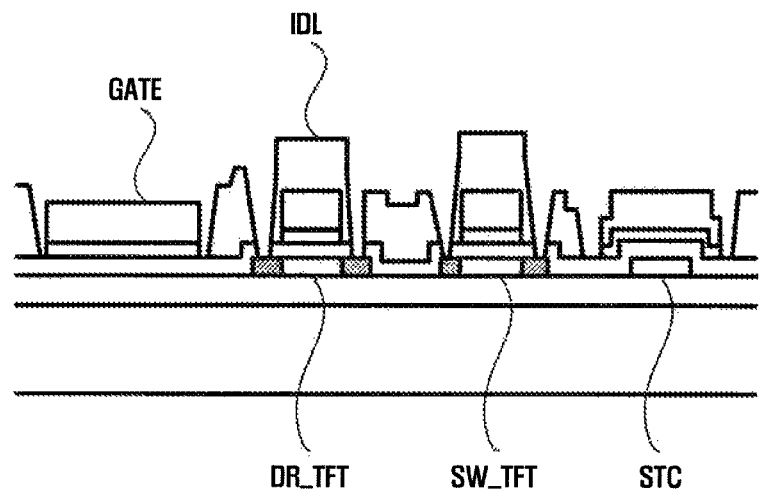
Figure 4:
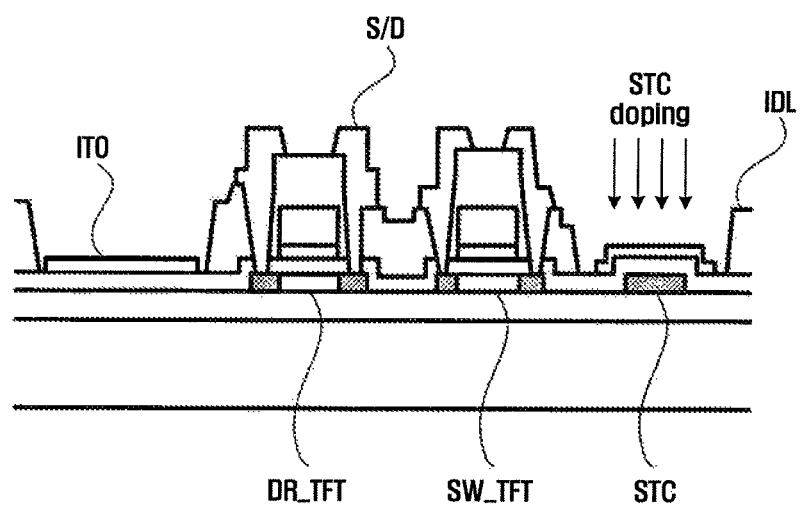
Figure 5:
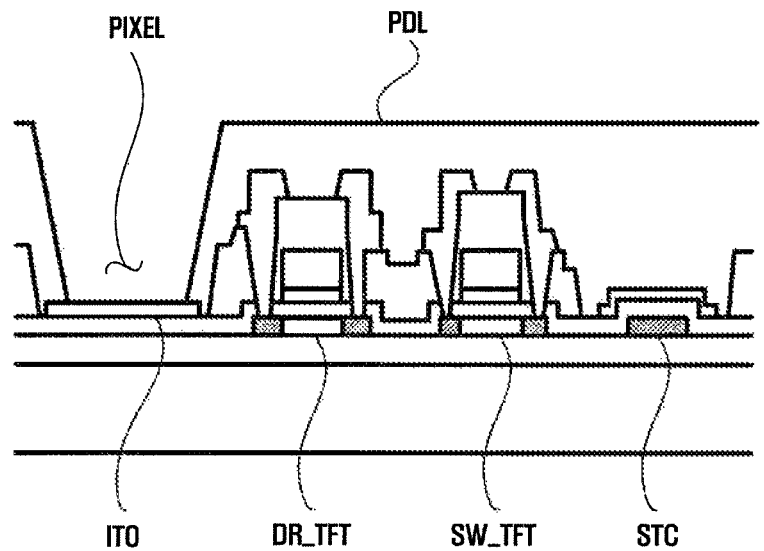
Figure 6:
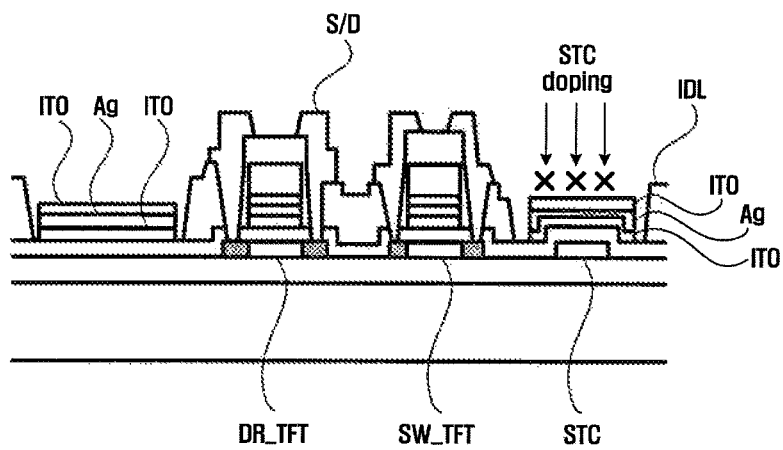

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. Like reference numerals refer to like elements throughout the specification. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to plan and cross-section illustrations that are schematic illustrations of embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, embodiments of the present invention will be described in further detail with reference to the accompanying drawings.

Figure 7:
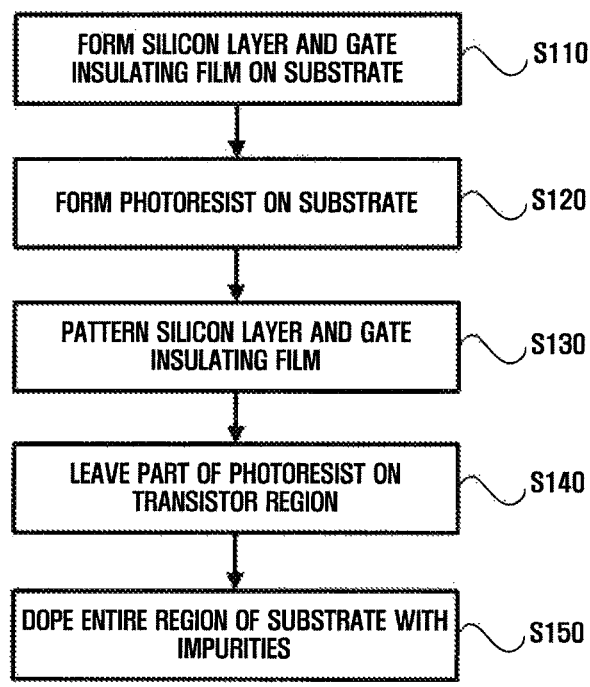
FIG. 7 is a flowchart illustrating a method of manufacturing an organic light-emitting display device according to an embodiment of the present invention.

Embodiments of the present invention will be described with reference to FIGS. 7 through 21. FIG. 7 is a flowchart illustrating a method of manufacturing an organic light-emitting display device according to an embodiment of the present invention. FIGS. 8 through 18 are cross-sectional views sequentially illustrating the method of manufacturing an organic light-emitting display device according to the embodiment. FIG. 19 is a cross-sectional view illustrating the alignment of a gate electrode formed using the method of manufacturing an organic light-emitting display device according to the embodiment.

The method of manufacturing an organic light-emitting display device, particularly, a bottom emission organic light-emitting display device according to the current embodiment of the present invention includes forming a silicon layer and a gate insulating film over a substrate having a transistor region and a capacitor region (operation S110), forming a photoresist over the substrate (operation S120), patterning the silicon layer and the gate insulating film (operation S130), forming a residual photoresist by leaving part of the photoresist unremoved (operation S140), and doping at least a portion of the silicon layer with impurities by applying the impurities over the entire region of the substrate (operation S150).

Figure 8:
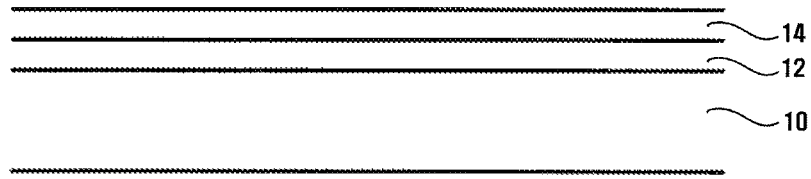
FIGS. 8 through 18 are cross-sectional views sequentially illustrating the method of manufacturing an organic light-emitting display device according to the embodiment.

Referring to FIG. 8, a substrate 10 is formed, a buffer layer 12 is formed on the substrate 10, and a silicon layer 14 is formed on the buffer layer 12.

The substrate 10 may be made of a transparent glass material containing SiO2 as a main component. However, the material that forms the substrate 10 is not limited to the transparent glass material. The substrate 10 may also be made of a transparent plastic material that may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

A transistor region, a capacitor region and a pixel region, in which a transistor, a capacitor and a pixel are formed, respectively, are formed in the substrate 10. There are no clear boundaries between the transistor region, the capacitor region, and the pixel region. A region of the substrate 10 on which a transistor is formed is defined as the transistor region, and a region of the substrate 10 on which a capacitor is formed is defined as the capacitor region.

In a bottom emission organic light-emitting display device in which an image is realized toward the substrate 10, the substrate 10 is made of a transparent material. However, in a top emission organic light-emitting display device in which an image is realized away from the substrate 10, the substrate 10 may not necessarily be made of a transparent material. In this case, the substrate 10 may be made of metal. When the substrate 10 is made of metal, the substrate 10 may contain at least one material selected from the group consisting of carbon (C), iron (Fe), chrome (Cr), manganese (Mn), nickel (Ni), titanium (Ti), molybdenum (Mo), and stainless steel (SUS). However, the material that forms the substrate 10 is not limited to the above materials. The substrate 10 may also be made of metal foil.

The buffer layer 12 may further be formed on the substrate 10 to planarize the substrate 10 and prevent penetration of impurities into the substrate 10. The buffer layer 12 may be a single layer of SiOx, SiNx or SiO2Nx, or a multilayer structure of these materials.

The silicon layer 14 is formed on the buffer layer 12. The silicon layer 14 may be made of silicon (Si), i.e., amorphous silicon (a-Si). Alternatively, the silicon layer 14 may be made of polycrystalline silicon (p-Si). When the silicon layer 14 is made of a-Si, a crystallization process may additionally be performed using, e.g., a laser. Otherwise, the silicon layer 14 may be made of, but is not limited to, Ge, GaP, GaAs, or AlAs.

Part of the silicon layer 14 may be doped with P-type or N-type impurities. As will be described later, the silicon layer 14 formed on the transistor region may be partially doped to form a semiconductor, and the silicon layer 14 formed on the capacitor region may be entirely doped to form a capacitor electrode.

Figure 9:
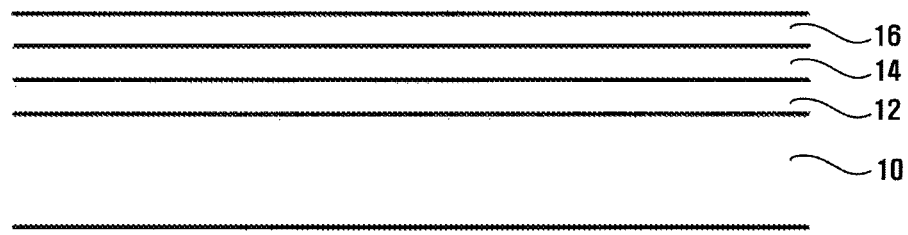

Referring to FIG. 9, a gate insulating film 16 is disposed on the silicon layer 14 to cover the silicon layer 14 and insulate the silicon layer 14 from gate electrodes 20. Like the buffer layer 12, the gate insulating film 16 may be a single layer of SiO2, SiNx or SiO2Nx, or a multilayer structure of these materials. The gate insulating film 16 may be made of the same material as the buffer layer 12 or of a different material from that of the buffer layer 12.

Figure 10:
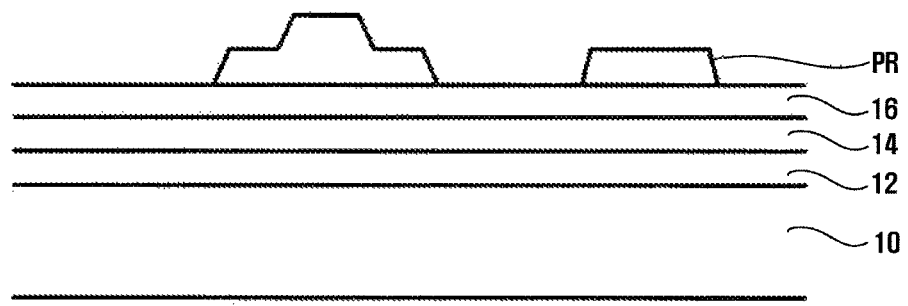

Referring to FIG. 10, a photoresist PR is coated on the gate insulating film 16 in order to pattern the silicon layer 14 and the gate insulating film 16. The photoresist PR coated in the forming of the photoresist on the substrate (operation S120) may be a halftone photoresist, so that the photoresist PR can be used not only to pattern the silicon layer 14 and the gate insulating film 16 but also used as a mask for preventing doping. The halftone photoresist PR may be formed only on the transistor region.

As shown in FIG. 10, the halftone photoresist PR may includes two tiers. When viewed in a thickness direction of the substrate, a lower tier of the halftone photoresist PR may be wider than an upper tier thereof.

Figure 11:
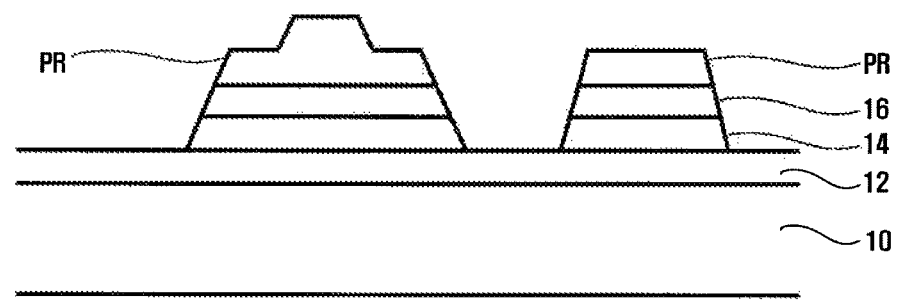

Referring to FIG. 11, the silicon layer 14 and the gate insulating film 16 are patterned (operation S130). An island-shaped structure on the left of FIG. 11 is a region in which a transistor is to be formed, and an island-shaped structure on the right of FIG. 11 is a region in which a capacitor is to be formed.

Figure 12:
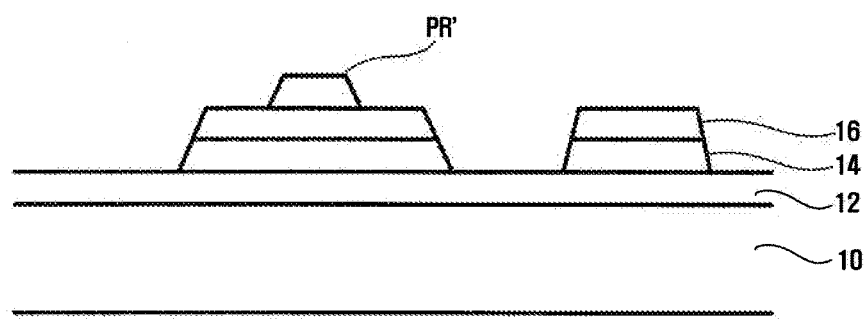

Referring to FIG. 12, a residual photoresist PR' is formed by leaving part of the photoresist PR unremoved (operation S140). When the photoresist PR is a halftone photoresist, an ashing process is performed on the halftone photoresist to make only the upper tier of the two-tier halftone photoresist remain, thereby forming the residual photoresist PR'. As described above, the residual photoresist PR' may remain only on the transistor region.

Figure 13:
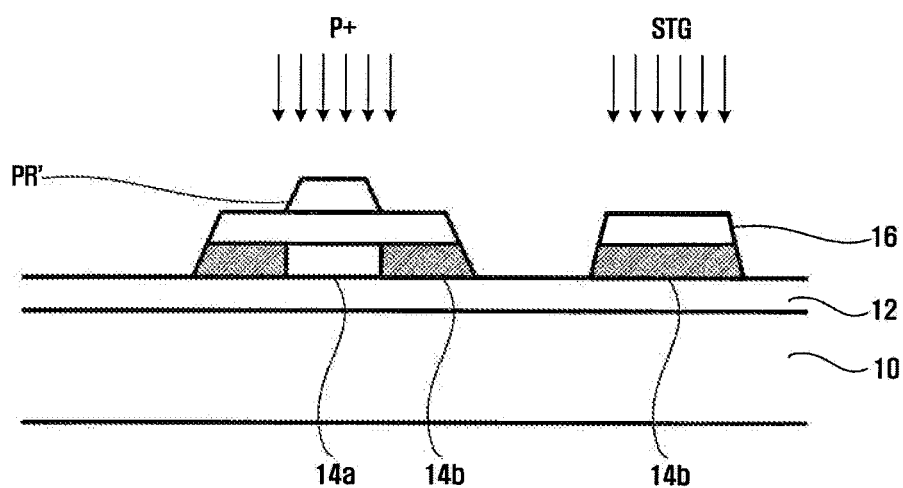

Referring to FIG. 13, the entire region of the substrate 10 is doped with impurities (operation S150). Since the residual photoresist PR' is formed on the gate insulating film 16 of the transistor region as shown in the drawing, the silicon layer 14 of the transistor region is divided into a first region 14a undoped with impurities and second regions 14b doped with impurities. Therefore, only the second regions 14b are electrodized.

On the other hand, the residual photoresist PR' does not exist on the gate insulating film 16 of the capacitor region. Therefore, the entire silicon layer 14 of the capacitor region forms the second region 14b doped with impurities and is turned into an electrode. As will be described later, the doped silicon layer, i.e., the second region 14b forms a capacitor electrode.

As described above, in the method of manufacturing an organic light-emitting display device according to the current embodiment, the silicon layer 14 of the transistor region and the silicon layer 14 of the capacitor region are entirely/partially formed into electrodes at a time by a single doping process. Therefore, a semiconductor and a capacitor electrode can be formed simultaneously.

In addition, since a single doping process is performed, the transistor region and the capacitor region can be doped using the same acceleration voltage of impurity ions. In particular, since only the single gate insulating film 16 is formed on the silicon layer 14 of the transistor region and the capacitor region, the silicon layer 14 of the transistor region and the silicon layer 14 of the capacitor region can be doped simultaneously without changing the acceleration voltage.

In the method of manufacturing an organic light-emitting display device according to the current embodiment, the silicon layer 14 is doped before the gate electrodes 20 are formed. Therefore, after the gate electrodes 20 and/or source and drain electrodes 24 are formed in a subsequent process, an annealing process is performed on the entire substrate 10 in order to improve contact resistance. This makes it unnecessary to perform an additional annealing process for reducing the resistance of the silicon layer 14 after the doping of the silicon layer 14, thereby reducing the processing time and cost.

Figure 14:
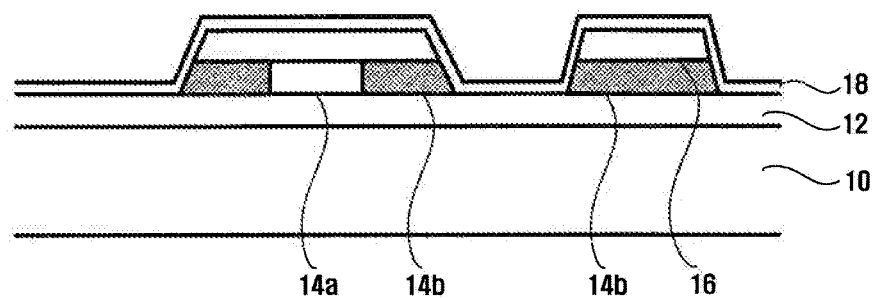

Referring to FIG. 14, an additional gate insulating film 18 may further be formed on the entire region of the substrate 10. The additional gate insulating film 18 may be made of the same material as the gate insulating film 16. The additional gate insulating film 18 can prevent a short circuit between the first and second regions 14a and 14b of the silicon layer 14 and one of the gate electrodes 20 that are to be formed on the additional gate insulating film 18.

Figure 15:
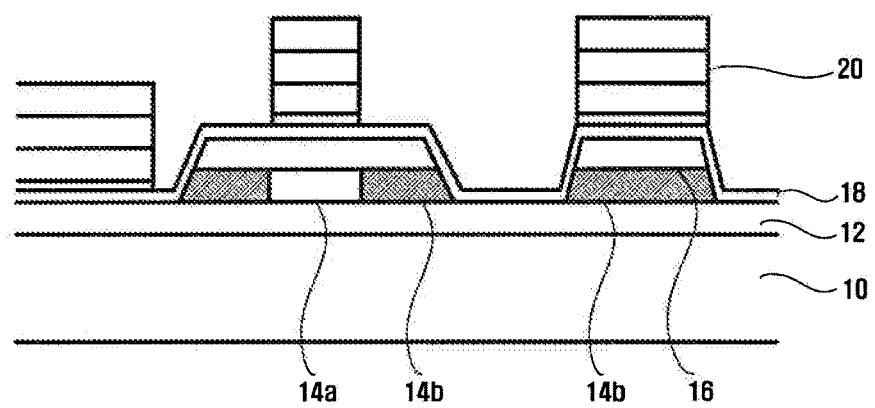

Referring to FIG. 15, the gate electrodes 20 are formed on the additional gate insulating film 18. Each of the gate electrodes 20 transmits a gate signal to control the light emission of each pixel. Each of the gate electrodes 20 may be a single layer of Al or an Al alloy, such as Cr—Al, Mo—Al or Al—Nd, or a multilayer structure of a Cr or Mo alloy and an Al alloy stacked on the Cr or Mo alloy. In addition, each of the gate electrodes 20 may contain one or more of indium tin oxide (ITO), Mo, and Al. In FIG. 15, each of the gate electrodes 20 is formed as a quadruple layer structure of ITO—Mo—Al—Mo stacked sequentially from the bottom.

Figure 16:
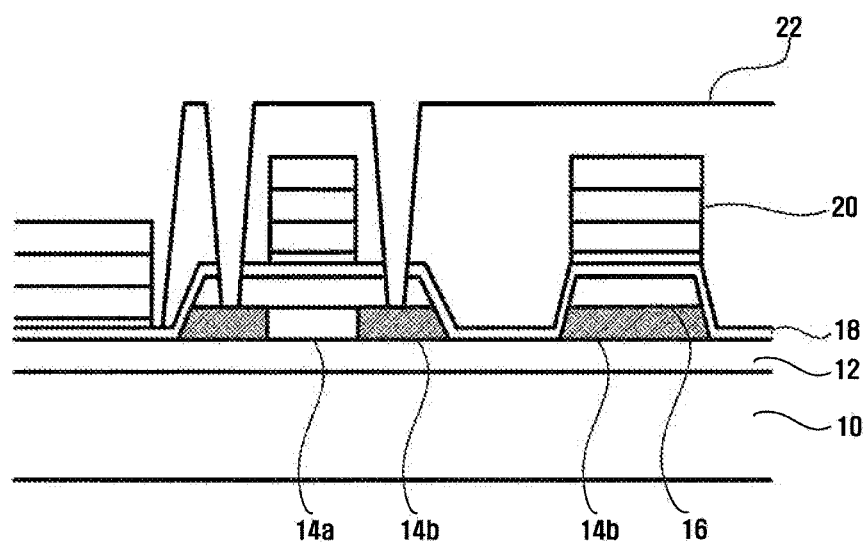

Referring to FIG. 16, an interlayer insulating film 22 is formed on the gate electrodes 20. The interlayer insulating film 22 electrically insulates the gate electrodes 20 from the source and drain electrodes 24. Like the buffer layer 12, the interlayer insulating film 22 may be a single layer of SiOx, SiNx or SiO2Nx, or a multilayer structure of these materials. An open portion for forming the pixel region and contact holes for forming the source and drain electrodes 24 are formed in the interlayer insulating film 22.

Figure 17:
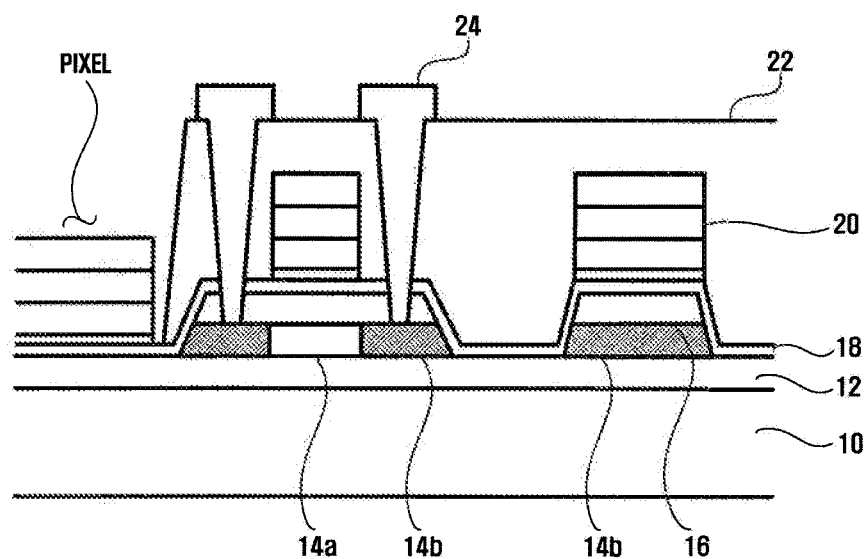

Referring to FIG. 17, the source and drain electrodes 24 electrically connected to the doped second regions 14b of the silicon layer 14 are formed on the interlayer insulating film 22. The source and drain electrodes 24 are electrically connected to the silicon layer 14 by the contact holes formed in the interlayer insulating film 22.

The source and drain electrodes 24 may be made of any one material selected from Mo, Cr, W, MoW, Al, Al—Nd, Ti, TiN, Cu, a Mo alloy, an Al alloy, and a Cu alloy. Alternatively, the source and drain electrodes 24 may be a triple layer structure of Mo—Al—Mo.

After the source and drain electrodes 24 are patterned, a gate electrode material and a source and drain electrode material of the pixel region (indicated by reference character 'PIXEL' in FIG. 17) may be etched simultaneously. Here, all layers excluding a transparent electrode formed on the pixel region may be etched.

Figure 18:
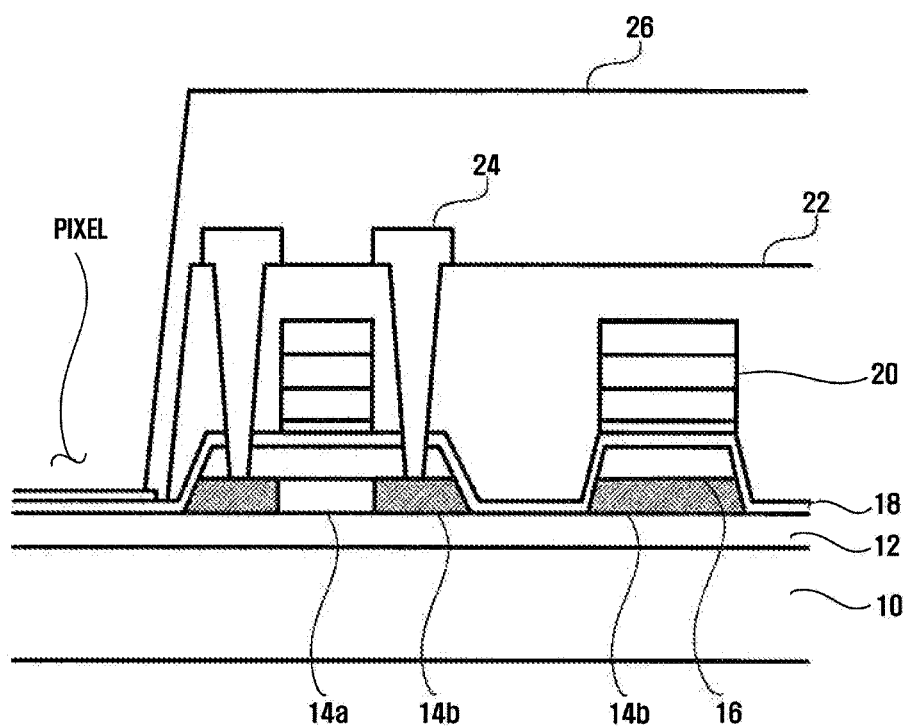
Figure 19:
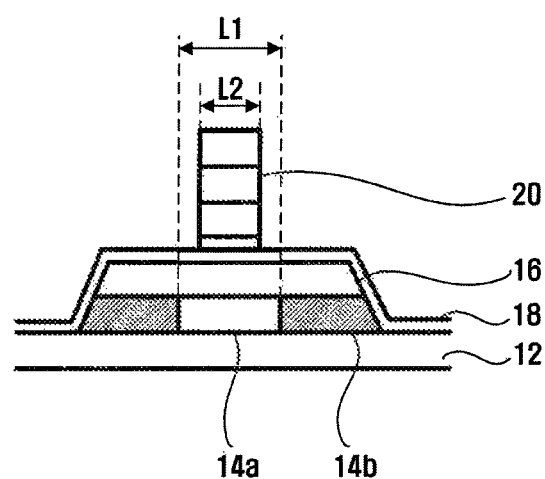
FIG. 19 is a cross-sectional view illustrating the alignment of a gate electrode formed using the method of manufacturing an organic light-emitting display device according to the embodiment.

Referring to FIG. 18, a pixel defining layer 26 defining the pixel region (indicated by reference character 'PIXEL' in FIG. 18) may be formed on the source and drain electrodes 24. The pixel defining layer 26 is formed on the entire substrate 10 to cover the transistor and the capacitor. An aperture exposing part of a pixel electrode is formed in the pixel defining layer 26 to define the pixel region.

Referring to FIG. 19, as described above, the silicon layer 14 may be divided into the first region 14a undoped with impurities due to the residual photoresist PR' and the second regions 14b doped with impurities. When viewed in a thickness direction of the substrate, a width L1 of the first region 14a may be greater than a width L2 of the gate electrode 20 on the transistor region.

When the gate electrodes 20 are formed after the doping process, if the gate electrode 20 of the transistor region is misaligned toward one of the second regions 14b on both sides of the gate electrode 20, current characteristics may be adversely affected. Thus, in order to maintain constant current characteristics even in the case of a slight misalignment, the width L1 of the first region 14a may be greater than the width L2 of the gate electrode 20 on the transistor region.

Figure 20:
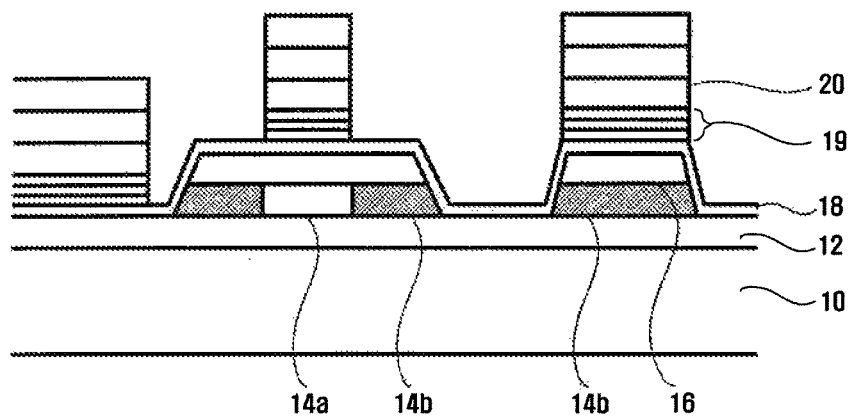
FIGS. 20 and 21 are cross-sectional views sequentially illustrating a method of manufacturing an organic light-emitting display according to another embodiment of the present invention.
Figure 21:
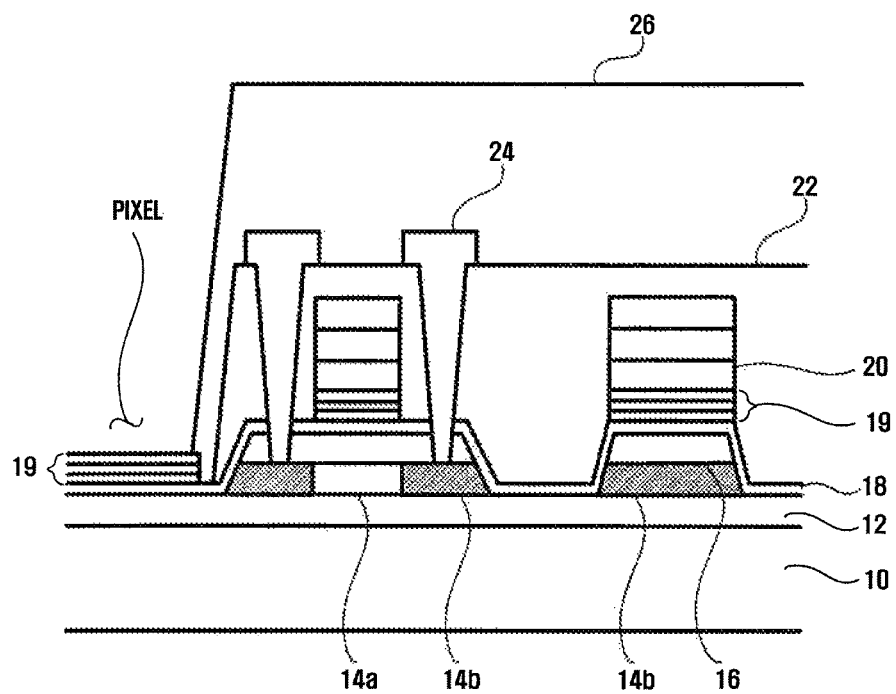
Figure 22:
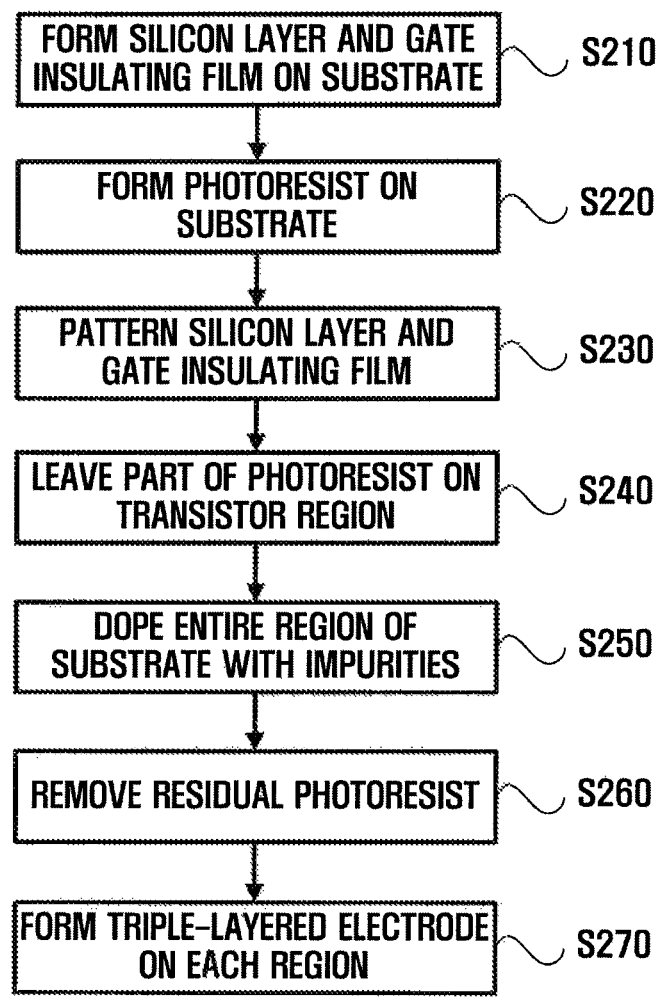
FIG. 22 is a flowchart illustrating a method of manufacturing an organic light-emitting display device according to another embodiment of the present invention.

Hereinafter, a method of manufacturing an organic light-emitting display device according to another embodiment of the present invention will be described with reference to FIGS. 20 to 22. FIGS. 20 and 21 are cross-sectional views sequentially illustrating a method of manufacturing an organic light-emitting display according to another embodiment of the present invention. FIG. 22 is a flowchart illustrating a method of manufacturing an organic light-emitting display device according to another embodiment of the present invention;

The method of manufacturing an organic light-emitting display device according to the current embodiment includes forming a silicon layer and a gate insulating film over a substrate having a pixel region, a transistor region, and a capacitor region (operation S210), forming a halftone photoresist over the substrate (operation S220), patterning the silicon layer and the gate insulating film (operation S230), forming a residual photoresist by subjecting the halftone photoresist to an ashing process to leave part of the halftone photoresist over the transistor region (operation S240), doping at least a portion of the silicon layer with impurities by applying the impurities over the entire region of the substrate (operation S250), removing the residual photoresist (operation S260), and forming a triple-layered electrode, which includes a transparent electrode material-a metal-a transparent electrode material, on each of the pixel region, the transistor region and the capacitor region (operation S270).

The current embodiment is the same as the previous embodiment, up to the doping of the entire region of the substrate with the impurities (operation S250). However, the current embodiment further includes the removing of the residual photoresist (operation S260) and the forming of the triple-layered anode electrode, which includes the transparent electrode material-the metal-the transparent electrode material, on each of the pixel region, the transistor region and the capacitor region (operation S270). In addition, as the previous embodiment, the current embodiment may further include forming an additional gate insulating film on the entire substrate before the forming of the triple-layered anode electrode.

Each gate electrode 20 according to the previous embodiment is a quadruple layer structure of ITO—Mo—Al—Mo. However, referring to FIG. 20, each gate electrode 20 according to the current embodiment is a triple layer structure of Mo—Al—Mo, and a triple-layered anode electrode 19, which includes a transparent electrode material-a metal-a transparent electrode material, is formed under each gate electrode 20.

The transparent electrodes that constitute the anode electrode 19 may include one or more materials selected from ITO, indium zinc oxide (IZO), carbon nanotubes, a conductive polymer, and nanowires. The metal interposed between the transparent electrodes may include silver (Ag). For example, the anode electrode 19 may include ITO—Ag—ITO.

The remaining processes are performed in the same way as those of the previous embodiment to produce an organic light-emitting display device as shown in FIG. 21. The anode electrode 19 is exposed through an aperture of the pixel region (indicated by reference character 'PIXEL' in FIG. 21). The anode electrode 19 including the Ag layer forms a resonance structure, thereby improving viewing angle characteristics of the organic light-emitting display device according to the current embodiment.

In the method of manufacturing an organic light-emitting display device according to the current embodiment, the anode electrode 19 having the resonance structure can be employed, and a silicon layer 14 of the transistor region and the capacitor region can be etched simultaneously.

While embodiments of the present invention has been particularly shown and described, it will be understood by those of ordinary skill in the art that various changes in form and detail may be made therein without departing from the spirit and scope of the present invention as defined by the following claims. The embodiments should be considered in a descriptive sense only and not for purposes of limitation.

What is claimed is:

1. A method of manufacturing a display device, the method comprising:
    forming a silicon layer over a substrate;
    forming an insulation film over the silicon layer;
    forming a photoresist mask over selected areas of the insulation film;
    patterning the silicon layer and the insulation film using the photoresist mask, thereby forming a transistor region and a capacitor region over the substrate, each region comprising a patterned insulation portion and a patterned silicon portion;
    selectively removing some of the photoresist mask remaining of the transistor region to form a residual photoresist in the transistor region while removing the entire photoresist mask of the capacitor region; and
    doping impurities simultaneously into the transistor and capacitor regions while substantially blocking part of the transistor region under the residual photoresist, which is a portion of the originally formed photoresist mask.

2. The method of claim 1, wherein the bottom emission organic light-emitting display device comprises:
    a semiconductor layer provided over the substrate and formed of a patterned silicon portion of the transistor region;
    a gate electrode insulated from the semiconductor layer and formed over the semiconductor layer; and
    a source electrode formed over the semiconductor layer and comprising an end connected to the semiconductor layer.

3. The method of claim 1, wherein the photoresist mask formed in the transistor region comprises a halftone photoresist which comprises two tiers, wherein a lower tier of the halftone photoresist is wider than an upper tier thereof when viewed in a thickness direction of the substrate.

4. The method of claim 3, wherein the residual photoresist comprises the upper tier of the halftone photoresist.

5. The method of claim 1, wherein the transistor region and the capacitor region are doped using the same acceleration voltage of impurity ions.

6. The method of claim 1, wherein the entire portion of the patterned silicon portion of the capacitor region is transformed into an electrode.

7. The method of claim 1, wherein parts of the patterned silicon portion of the transistor region that are not disposed under the residual photoresist are transformed into electrodes.

8. A method of manufacturing a bottom emission organic light-emitting display device, the method comprising:
    forming a silicon layer over a substrate;
    forming an insulation film over the silicon layer;
    forming a photoresist mask over selected areas of the insulation film;
    patterning the silicon layer and the insulation film using the photoresist mask, thereby forming a transistor region and a capacitor region over the substrate, each region comprising a patterned insulation portion and a patterned silicon portion;
    selectively removing some of the photoresist mask of the transistor region by subjecting the photoresist mask to an ashing process to form a residual photoresist in the transistor region while removing the entire photoresist mask of the capacitor region; and
    doping impurities simultaneously into the transistor and capacitor regions while substantially blocking part of the transistor region under the residual photoresist, which is a portion of the originally formed photoresist mask.

9. The method of claim 8, wherein the transistor region and the capacitor region are doped using the same acceleration voltage of impurity ions.

10. The method of claim 8, wherein the entire portion of the patterned silicon portion of the capacitor region is transformed into an electrode.

11. The method of claim 8, wherein parts of the patterned silicon portion of the transistor region that are not disposed under the residual photoresist are transformed into electrodes.

12. A method of manufacturing a bottom emission organic light-emitting display device, the method comprising:
    forming a silicon layer over a substrate;
    forming an insulation film over the silicon layer;
    forming a photoresist mask over selected areas of the insulation film;
    patterning the silicon layer and the insulation film using the photoresist mask, thereby forming a transistor region and a capacitor region over the substrate, each region comprising a patterned insulation portion and a patterned silicon portion;
    selectively removing some of the photoresist mask of the transistor region to form a residual photoresist in the transistor region while removing the entire photoresist mask of the capacitor region;
    doping impurities simultaneously into the transistor and capacitor regions while substantially blocking part of the transistor region under the residual photoresist, which is a portion of the originally formed photoresist mask;
    removing the residual photoresist; and
    subsequently, forming a gate electrode, an interlayer insulating film, source and drain electrodes, and a pixel defining layer.

13. The method of claim 12, wherein the gate electrode is made of one or more selected from the group consisting of indium tin oxide (ITO), molybdenum (Mo), and aluminum (Al).

14. The method of claim 13, wherein the gate electrode is a quadruple layer structure of ITO—Mo—Al—Mo.

15. The method of claim 12, wherein the source and drain electrode is made of one or more of Mo and Al.

16. The method of claim 15, wherein the source and drain electrode is a triple layer structure of Mo—Al—Mo.

17. The method of claim 12, wherein the patterned silicon portion of the transistor region comprises an undoped portion and doped portions, wherein the doped portions are transformed into electrodes.

18. The method of claim 17, wherein the undoped portion is wider than the gate electrode disposed over the transistor region when viewed in a thickness direction of the substrate.

19. The method of claim 12, further comprising forming an additional insulation film over the entire substrate before the forming of the gate electrode.

20. A method of manufacturing a bottom emission organic light-emitting display device, the method comprising:

forming a silicon layer over a substrate;

forming an insulation film over the silicon layer;

forming a photoresist mask over selected areas of the insulation film;

patterning the silicon layer and the insulation film using the photoresist mask, thereby forming a transistor region and a capacitor region over the substrate, each region comprising a patterned insulation portion and a patterned silicon portion;

selectively removing some of the photoresist mask of the transistor region to form a residual photoresist in the transistor region while removing the entire photoresist mask of the capacitor region;

doping impurities simultaneously into the transistor and capacitor regions while substantially blocking part of the transistor region under the residual photoresist, which is a portion of the originally formed photoresist mask;

removing the residual photoresist; and forming, over each of the transistor region and the capacitor region, a triple-layered anode electrode which comprises a transparent electrode material-a metal-a transparent electrode material.

21. The method of claim 20, wherein the triple-layered anode electrode comprises ITO-silver (Ag)—ITO.

22. The method of claim 20, further comprising forming an additional insulation film over the entire substrate before the forming of the triple-layered anode electrode.

23. The method of claim 20, further comprising forming a gate electrode over the triple-layered anode electrode.

24. The method of claim 23, wherein the gate electrode is a quadruple layer structure of ITO—Mo—Al—Mo.

* * * * *